United States Patent [19]
Parrillo

[11] Patent Number: 4,889,825
[45] Date of Patent: Dec. 26, 1989

[54] HIGH/LOW DOPING PROFILE FOR TWIN WELL PROCESS

[75] Inventor: Louis C. Parrillo, Austin, Tex.

[73] Assignee: Motorola, Inc., Schaumburg, Ill.

[21] Appl. No.: 147,635

[22] Filed: Jan. 25, 1988

Related U.S. Application Data

[62] Division of Ser. No. 841,383, Mar. 4, 1986, abandoned.

[51] Int. Cl.$^4$ .................. H01L 21/265; H01L 27/00
[52] U.S. Cl. ........................... 437/34; 437/56; 437/57; 437/28; 437/27; 357/42; 357/91; 357/23.11
[58] Field of Search ............ 437/27, 28, 34, 56, 437/57; 357/23.11, 42, 91

[56] References Cited

U.S. PATENT DOCUMENTS

| | | | |
|---|---|---|---|
| 4,295,266 | 10/1981 | Hsu | 437/34 |
| 4,391,650 | 7/1983 | Pfeifer et al. | 437/34 |
| 4,409,726 | 10/1983 | Shiota | 437/34 |
| 4,411,058 | 10/1983 | Chen | 29/571 |
| 4,422,885 | 12/1983 | Brower et al. | 357/42 |
| 4,434,543 | 3/1984 | Schwabe et al. | 437/34 |
| 4,435,895 | 3/1984 | Parrillo et al. | 357/42 |
| 4,459,741 | 7/1984 | Schwabe et al. | 357/42 |
| 4,481,705 | 11/1984 | Haskell | 437/34 |
| 4,516,316 | 5/1985 | Haskell | 437/34 |
| 4,525,920 | 7/1985 | Jacobs et al. | 437/34 |
| 4,535,532 | 8/1985 | Lancaster | 437/34 |
| 4,549,340 | 10/1985 | Nagasawa et al. | 437/34 |
| 4,554,726 | 11/1985 | Hillenius et al. | 357/42 |
| 4,558,508 | 12/1985 | Kinney et al. | 357/42 |
| 4,574,467 | 3/1986 | Halfacre et al. | 437/34 |
| 4,584,027 | 4/1986 | Metz et al. | 357/42 |
| 4,626,450 | 12/1986 | Tani et al. | 437/34 |
| 4,657,602 | 4/1987 | Henderson, Sr. | 437/34 |
| 4,684,971 | 8/1987 | Payne | 357/42 |
| 4,710,477 | 12/1987 | Chen | 437/34 |
| 4,713,329 | 12/1987 | Fang et al. | 437/34 |
| 4,717,683 | 1/1988 | Parrillo et al. | 437/34 |
| 4,761,384 | 8/1988 | Neppl et al. | 437/34 |
| 4,771,014 | 9/1988 | Liou | 437/34 |

FOREIGN PATENT DOCUMENTS

| | | | |
|---|---|---|---|
| 0155767 | 9/1982 | Japan | 437/34 |
| 2056167 | 3/1981 | United Kingdom | 437/34 |

OTHER PUBLICATIONS

Chen, "Quadruple-Well CMOS-A VLSI Technology", IEEE Int. Electron Devices Meeting (12/82), Tech. Dig., pp. 791-792.

Parrillo et al., "Twin-Tub CMOS II-An Advanced VLSI Technology", IEEE Int. Electron Devices Meeting (12/82), Tech. Dig., pp. 706-709.

*Primary Examiner*—Brian E. Hearn
*Assistant Examiner*—M. Wilczewski
*Attorney, Agent, or Firm*—John A. Fisher

[57] ABSTRACT

A process for forming n- and p-wells in a semiconductor substrate wherein each well has a shallow, highly-doped surface layer whose depth may be independently controlled. This high/low doping profile for a twin well CMOS process may be produced using only one mask level. The method provides high/low impurity profiles in each well to optimize the NMOS and PMOS active transistors; provides close NMOS to PMOS transistor spacing; avoids a channel-stop mask level and avoids a threshold adjustment/punchthrough mask level.

4 Claims, 5 Drawing Sheets

HIGH/LOW DOPING PROFILE FOR TWIN WELL PROCESS

This application is a division of application Ser. No. 841,383, filed Mar. 4, 1986, now abandoned.

FIELD OF THE INVENTION

The invention is related to integrated circuit structures and methods of fabricating them, and is particularly related to integrated circuits fabricated upon a "twin well" or "twin tub" structure.

BACKGROUND OF THE INVENTION

A primary concern in fabricating complementary metal-oxide-semiconductor (CMOS) structures is the method for forming the substrates for the two types of MOS field effect transistors (MOSFETs). Early CMOS processes were developed to be compatible with the p-channel MOS (PMOS) process; hence n-channel transistors were formed in a p diffusion tub or well in the n substrate. Although some of the early processing constraints disappeared, the traditional p-well approach has remained the most widely used CMOS structure.

A p well may be implanted or diffused into an n substrate at a concentration high enough to overcompensate the n substrate and give good control over the resultant p-type doping. Typically, the doping level in the p well is five to ten times higher than that in the n-type substrate to attain this control. However, this high p-tub doping causes undesirable effects in the n-channel transistor such as increased back-gate bias effects and increased source/drain to p-well capacitance.

An alternate approach is to employ an n well to form the p-channel transistors. In this situation, the n-channel device is formed in the p-type substrate and the n-well is compatible with standard NMOS processing. However, the n well tends to overcompensate the p substrate and the p-channel devices suffer from excessive doping effects.

Another approach uses two separate wells implanted into very lightly doped n-type silicon. This "twin well" CMOS approach permits the doping profiles in each well region to be independently designed, so that neither type of device suffers from excessive doping effects. Such an approach has been used on lightly doped n-type and p-type substrates.

Briefly in a twin well CMOS process, the starting material is lightly doped n epitaxy over a heavily doped n+ substrate. If this structure is combined with proper layout techniques, CMOS circuits that are not prone to latchup are produced. Typically, after the wells are formed, isolation regions are created at the interfaces of the wells to isolate the p-channel devices from the n-channel devices. For more information on CMOS well technology, see S. M. Sze, ed. *VLSI Technology*, McGraw-Hill, 1983, pp. 478-485.

Figure 1:
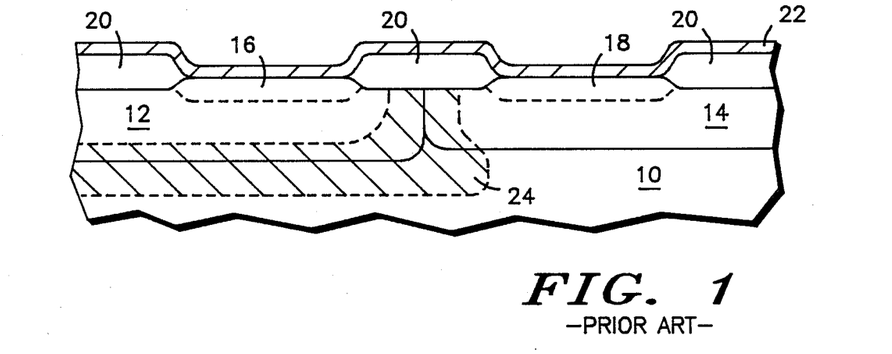
FIG. 1 is a cross-sectional illustration of a prior art boundary between two wells of different conductivity types.

Shown in FIG. 1 is a CMOS structure having a lightly doped n substrate 10 within which are formed a p well 12 and an n well 14 having an n source 16 and a p source 18 respectively. The devices are isolated from each other via field oxide regions 20 and interconnection is provided by polycrystalline silicon (polysilicon) layer 22. It has been discovered with CMOS devices that when the wells are driven in, appreciable lateral diffusion occurs and interdiffusion of the wells forms a depletion region 24 under the isolation regions 20 and that if the depletion region 24 is wide enough or the substrate is too lightly doped, the depletion regions of the sources 16 and 18 and drains of adjacent transistors may punchthrough to each other and form an undesirable parasitic transistor. This effect prevents the devices from being placed close to each other and requires the use of additional chip area.

Figure 2:
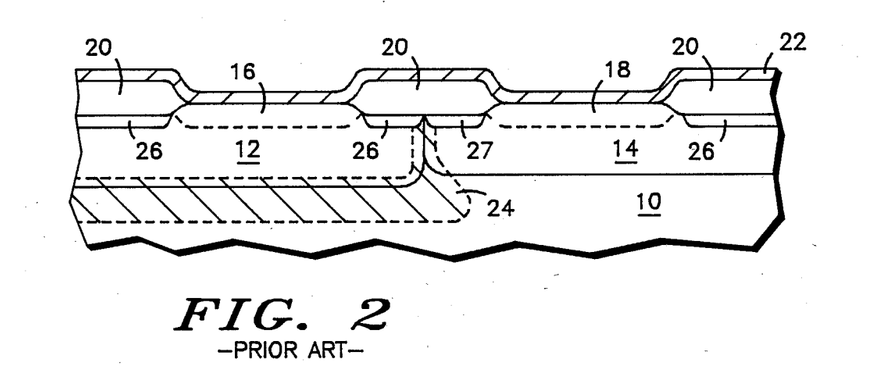
FIG. 2 is a cross-sectional illustration of a prior art boundary between two wells of different conductivity types which have precisely aligned channel stop regions present at the boundary.

The typical solution to this problem is to form channel stop regions or "chan stops" 26 and 27 which are more highly doped regions between the active device sources 16 and 18, as seen in FIG. 2. The p-channel stop 26 and n-channel stop 27 effectively narrow the area of the depletion region 24 and permit the devices to be placed closer together. One process which employs a lift-off technique to help form combined channel stop/well regions is described by J. Y. Chen in "Quadruple-Well CMOS —A VLSI Technology," *Tech. Digest, IEEE IEDM,* 1982, pp. 791-792. See also U.S. Pat. No. 4,558,508 issued to Kinney, et al. on Dec. 17, 1985.

Figure 3:
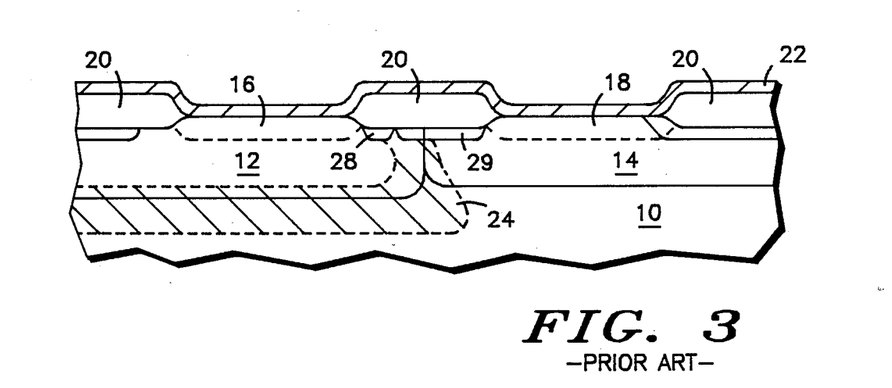
FIG. 3 is a cross-sectional illustration of a prior art boundary between two wells of different conductivity types which have misaligned channel stop regions at the well boundary.

However, even with a single mask channel stop process, channel stops are often misaligned as seen in the case of misaligned channel stops 28 and 29 of FIG. 3. Because the channel stops 28 and 29 in a twin well or single well structure must be individually placed at the edge of each well, the potential for misalignment is great and the depletion region 24 is not narrowed as much as desired, causing a greater possibility of punchthrough. Using a two mask channel stop process has even greater potential for misalignment.

FIG. 4 illustrates a more typical process of forming twin well regions and an isolation oxide and channel stop between the regions. In FIG. 4A, the future n well region of the substrate 30 is receiving a phosphorus implant, represented with the Xs, through pad oxide 32 while the future p well region is shielded by nitride pattern 34. The structure in FIG. 4B is produced by driving in the phosphorus to produce n well 36, growing thick oxide layer 38 and stripping the nitride pattern 34. A boron implant is then conducted as illustrated by the dots in FIG. 4B, with n well 36 being protected by the thick oxide layer 38.

Figure 4A:
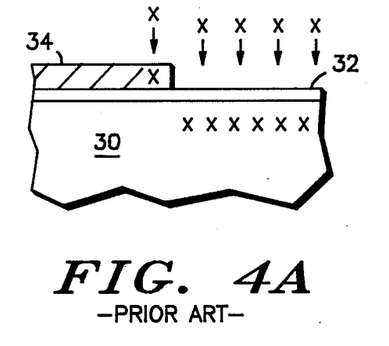
FIG. 4A is a cross-sectional illustration of a prior art structure under construction showing a masked implant step for a well of a first conductivity type.
Figure 4B:
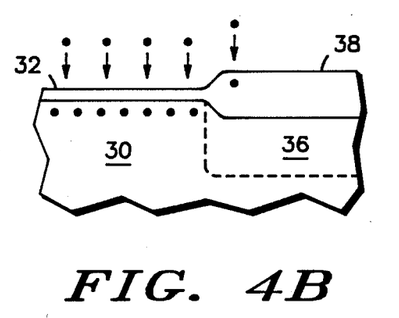
FIG. 4B illustrates the structure of FIG. 4A after a field oxide-type structure has been grown showing how it masks an implant for the well of a second conductivity type.
Figure 4C:
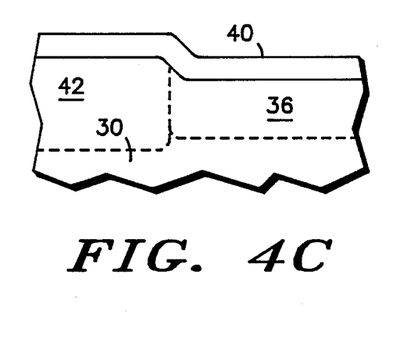
FIG. 4C shows the result of annealing the structure of FIG. 4B to form wells in an oxidizing ambient which also forms a uniform oxide layer.
Figure 4D:
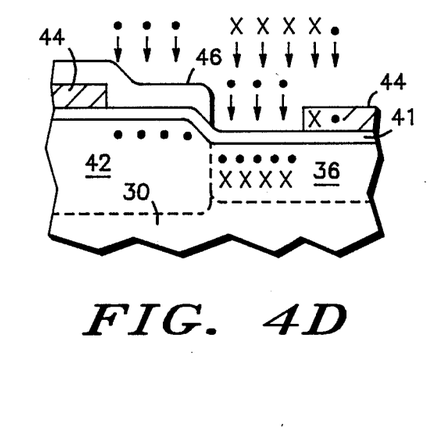
FIG. 4D illustrates the structure of FIG. 4C during a masked implant step.
Figure 4E:
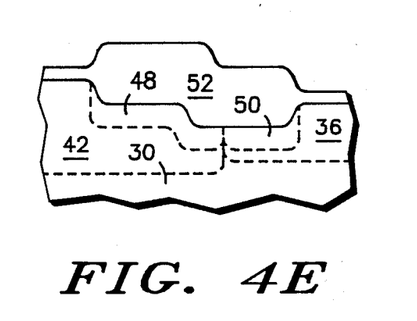
FIG. 4E shows the implant structure of FIG. 4D after the implants therein are annealed to form channel stop regions and after the formation of an isolation region.

Next, the thick oxide layer 38 is stripped and a new oxide layer 40 is grown during which the p well 42 is driven in as seen in FIG. 4C. Oxide layer 40 is stripped, a new pad oxide 41 is grown and second nitride pattern 44 is formed, after which a second boron implant is conducted in the region to be the channel stop as defined by the nitride pattern 44. Photoresist pattern 46 is formed to permit the second phosphorus implant into the n well channel stop region as seen in FIG. 4D. Next, the photoresist pattern 46 is removed and the impurities are driven in slightly to form p chan stop 48 and n .chan stop 50 during or after which field oxide isolation region 52 is grown. The second nitride pattern 44 is then removed to give the structure seen in FIG. 4E.

The process described relative to FIG. 4 has a number of disadvantages, not the least of which is the fact that two mask steps are used, with their attendant risks of misalignment and the disadvantages caused by channel stop misalignment as discussed earlier. The depletion region is not as narrow as would be desired and the devices may not be placed as closely together as is desired.

An alternative process has been proposed by Hillenius and Parrillo in U.S. Pat. No. 4,554,726 (incorporated by reference herein), as illustrated in FIG. 5 which uses a single mask and permits the use of a high/low doping profile for the wells. The process begins by the future n well region of the substrate 54 receiving both an arsenic, as represented by the triangles in FIG. 5A, and a phosphorus implant, as represented by the Xs, through a blanket pad oxide 56. The future p well region is shielded by nitride pattern 58, which is the only pattern needed for the graded well formation process. By a "graded well" is meant a well with a high-low doping profile; the relatively higher doping concentration being nearer the surface.

Figure 5A:
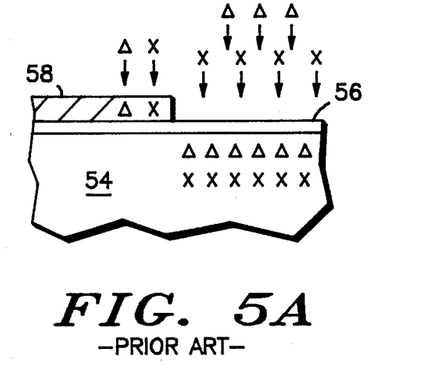
FIG. 5A illustrates the masked double-implantation into a semiconductor substrate which begins the process of forming another prior art twin-well structure.
Figure 5B:
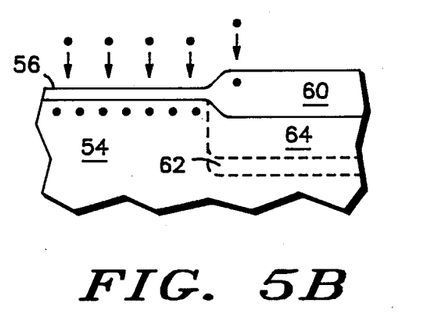
FIG. 5B shows the result of annealing the structure of FIG. 5A after an annealing step to simultaneously drive-in both implants, after the growth of a field oxide-like structure and during an implantation step for an adjacent well.

Next, a thick oxide layer 60 is formed in the n-well region and the nitride pattern 58 is stripped. In the drive-in step for the graded n-well, which may occur during oxide layer 60 formation, the slow diffusing arsenic does not diffuse as far into the silicon with respect to the relatively fast diffusing phosphorus to give n-well 62 and highly doped surface region 64. However, since these regions 62 and 64 are driven-in simultaneously, it is difficult to achieve a shallow depth of highly doped arsenic surface region 64 if the n-well 62 is driven-in to its desired depth. As shown in FIG. 5B, the highly doped arsenic region 64 is not confined to surface proximity as would be desired. P-channel devices subsequently formed in n-well 62 perform extremely poorly.

Figure 5C:
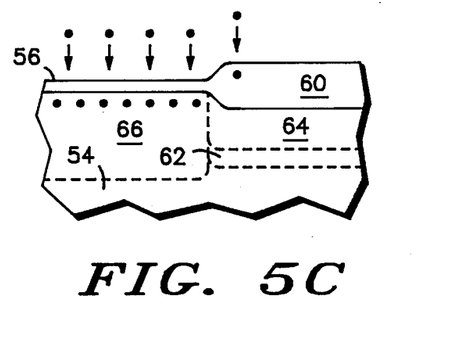
FIG. 5C illustrates the structure resulting from annealing the structure of FIG. 5B during a second implant to form a surface doping layer for the unmasked well, FIG. 5D provides an illustration of the FIG. 5C structure after all implant regions have been annealed, the field oxide-like structure has been removed, and a masked has been formed to permit selective fabrication of the isolation regions.
Figure 5D:
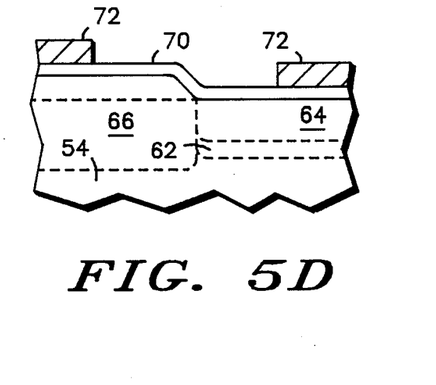
Figure 5E:
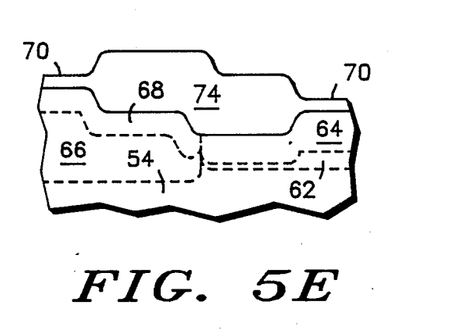
FIG. 5E illustrates the structure resulting from forming an isolation region using the masked structure of FIG. 5D, after the mask has been removed.

As seen in FIG. 5B, the next step is the first boron p-well implant, as symbolized by the dots. This implant is driven-in to form p-well 66, after which a second boron implant for the highly concentrated surface region is conducted as shown in FIG. 5C. Since the drive-in of the second boron implant is performed as a separate step, the depth of highly doped boron surface region 68 may be independently determined and may be actually restricted to just below the surface unlike highly doped arsenic region 64, which must be jointly driven-in with the phosphorus. Stripping the thick oxide layer 60, forming a uniform dielectric oxide layer 70 and depositing a nitride pattern 72 produces the structure seen in FIG. 5D. Forming field oxide region 74 by high pressure oxidation or other means gives the finished isolation boundary seen in FIG. 5E. While the n-channel devices subsequently made in the p-well 66 of this structure perform well, the p-channel devices in n-well 62 suffer from excessive doping effects such as source/drain to well capacitance and body effect due to the fact that heavily doped arsenic layer 64 is too deep.

Thus, it would be desirable if a process were discovered which produced four independent well/field implants that are self-aligned, particularly if they did not require subsequent compensation implants and the depth of the heavily doped surface layers could be precisely controlled. Preferably, the channel stops produced by these implants would permit close spacing between adjacent NMOS and PMOS devices due to a low parasitic leakage, since the depletion region beneath the interface field oxide would be narrow.

SUMMARY OF THE INVENTION

Accordingly, it is an object of the present invention to provide a structure and process for making a structure having close spacing between adjacent NMOS and PMOS devices due to a low parasitic field leakage between the devices.

Another object of the present invention is to provide a twin well structure and process for making the same in which relatively higher doped (e.g. $5 \times 10^{16}$ atoms/cm$^3$) surface layers are present in each well to give a graded well structure.

It is another object of the present invention to provide a twin well structure and process therefor in which the depth of the relatively higher doped surface layers in each well may be shallow and precisely controlled.

Still another object of the present invention is to provide a twin well structure and process therefor in which relatively higher doped surface regions may be introduced into each well by using only one mask pattern.

In carrying out these and other objects of the invention, there is provided, in one form, an integrated circuit built on a semiconductor substrate having a planar surface, which has formed therein a plurality of deep, low-doped wells of a first conductivity type in selected areas of the semiconductor substrate surface and a plurality of deep, low-doped wells of a second conductivity type in selected areas of the substrate different from those of the first conductivity type. Further, shallow, relatively higher-doped layers of a first conductivity type are present in selected ones of the plurality of deep, low-doped wells of the first conductivity type; and shallow, relatively higher-doped layers of a second conductivity type are present in selected ones of the plurality of deep, low-doped wells of the second conductivity type.

BRIEF DESCRIPTION OF THE DRAWINGS

FIG. 4 is a cross-sectional illustration of the prior art process for forming conventional channel stop regions at the boundary of two wells of different conductivity types, where

FIG. 5 is a cross-sectional illustration of a prior art process for forming a high-low well doping profile in two adjacent wells of different conductivity types using one mask; where FIG. 6 is a cross-sectional illustration of the method of this invention demonstrating how high-low well doping profiles in two adjacent wells of different conductivity types may be formed with independent and precise depth control of each high-low well portion, and one mask, where FIG. 6C-1 shows the structure of FIG. 6B after the growth of a field oxide-like region to consume a selected portion of the blanket implant, FIG. 6D-1 illustrates the structure of FIG. 6C-1 after the removal of the field oxide-like region, formation of a pad layer and during an implant for an adjacent well, FIG. 6C-2 shows the structure of FIG. 6B during a second implantation step or another embodiment of the process, FIG. 6D-2 is a cross-sectional illustration of the structure of FIG. 6C-2 after the growth of a field oxide-like region to selectively consume part of the implanted well, FIG. 6C-3 shows the structure of FIG. 6B after an etch of part of the substrate to consume a selected portion of the blanket implant, according to a third embodiment of the process, FIG. 6D-3 illustrates the structure of FIG. 6C-3 after the growth of a screen layer during a second implant step.

It should be noted that, for clarity, in each of the drawings the vertical proportions are greatly exaggerated relative to the horizontal proportions that would be seen on actual structures.

DETAILED DESCRIPTION OF THE INVENTION

Since the prior art processes and structures of FIGS. 1 through 5 have already been explained in detail, the present invention will now be outlined with respect to FIG. 6. A semiconductor substrate 76 is first provided, upon which a blanket pad oxide 78 is formed by any of the well-known techniques. As seen in FIG. 6A, a dopant of one type is next blanket implanted into the substrate 76 through pad oxide 78. In this illustrative description, this first implant is a shallow boron implant to form the eventual p-well, although it is conceivable that the n-well implant could be conducted first and the dopant conductivity types throughout this description would be reversed. However, in some cases this may not be desired.

Figure 6A:
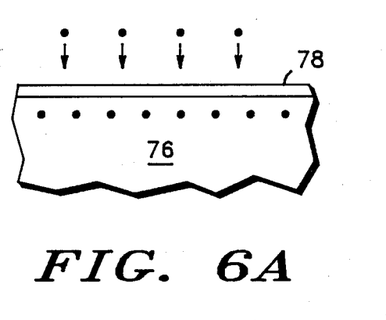
FIG. 6A is a cross-sectional illustration of a semi-conductor substrate receiving a blanket implant.
Figure 6B:
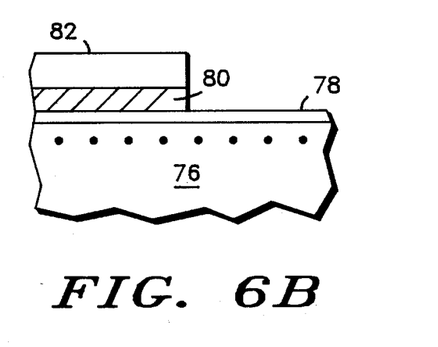
FIG. 6B is a cross-sectional illustration of the twin-well structure of the invention under construction showing the structure of FIG. 6A with part of the substrate selectively masked.

Next, a layer of silicon nitride 80 is formed and patterned using photoresist layer 82 to give the structure shown in FIG. 6B, wherein the exposed region overlies the future n-well and the silicon nitride pattern 80 overlies the future p-well.

The next part of the procedure involves removing the boron impurity from the future n-well region and introducing phosphorus impurity therein to enable the production of the n-well. These goals may be accomplished in at least three different ways, which will be described separately.

Figure 6C:
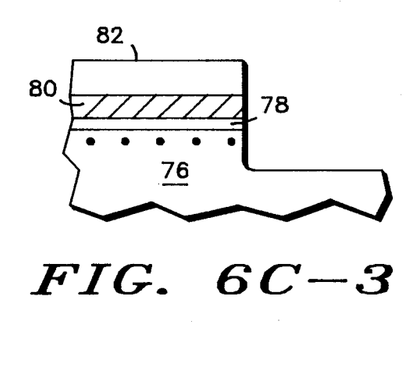
Figure 6C:
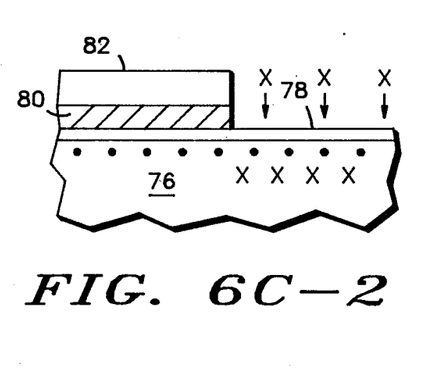
Figure 6C:
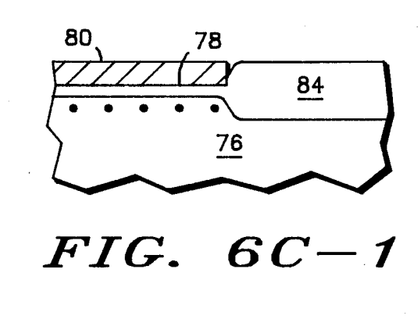
Figure 6D:
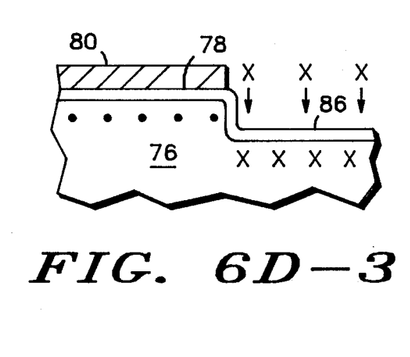
Figure 6D:
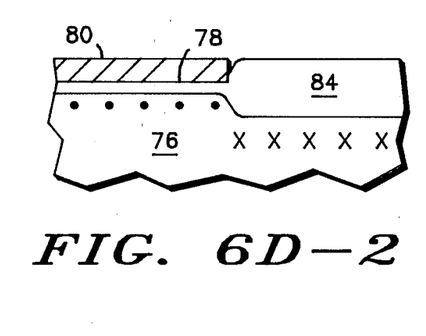
Figure 6D:
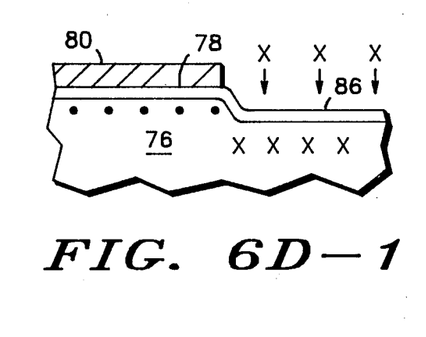

The first option is illustrated in FIGS. 6C-1 and 6D-1 and involves first stripping the photoresist pattern 82, and then via high-pressure oxidation, or other means, forming thick silicon oxide region 84. The region of silicon substrate 76 in the future n-well having the boron doping is absorbed into this thick silicon oxide region 84 which is next physically removed. A screen oxide layer 86 is next formed through which phosphorus is ion implanted as represented by the Xs in FIG. 6D-1. The p-well region is shielded from the phosphorus by nitride pattern 80. Finally, the p-well 88 and n-well 90 are driven in simultaneously to give the structure of FIG. 6E.

Figure 6E:
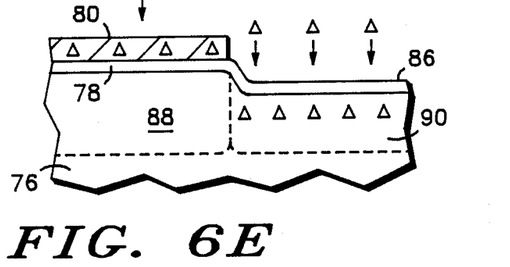
FIG. 6E shows a cross-section of the structure from FIGS. 6D-1, 6D-2 and 6D-3 in a subsequent shallow implant step.

The second option involves implanting the phosphorus impurity at a high energy through pad oxide layer 78 to a depth much deeper than that of the boron impurity, if a high pressure oxidation is employed subsequently, shown in FIG. 6C-2. If a different oxidation technique is used, the implant can be conducted at a lower energy and the implant depth need not be deep since the phosphorus piles up in the silicon and the boron tends to migrate to the oxide. Now the resist layer 82 is stripped and the thick oxide region 84 is grown to absorb that portion of the silicon 76 which is boron-doped, as seen in FIG. 6D-2. Finally, the oxide layer 84 is stripped and the p-well 88 and n-well 90 are driven in simultaneously. Screen oxide layer 86 is formed last, as shown in FIG. 6E.

In a third alternative, the portion of the silicon substrate 76 having the boron impurity is etched away to give the structure of FIG. 6C-3. Screen oxide 86 is formed and phosphorus is implanted as shown in FIG. 6D-3. The simultaneous drive-in step to form the p-well 88 and the n-well 90 is conducted as before to give the structure of FIG. 6E. This third option has the advantages of being sure that nearly all of the boron is removed from the future n-well area and not requiring a thick oxide formation step. On the other hand, this option exposes the silicon to a reactive ion etch (RIE), which may not be desirable, and requires precise control of the silicon etch.

Figure 6F:
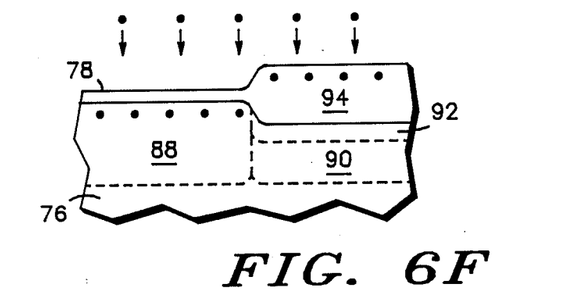
FIG. 6F presents a cross-sectional illustration of the FIG. 6E structure after the growth of a field oxide-like structure, removing the mask and conducting the final shallow implantation.
Figure 6G:
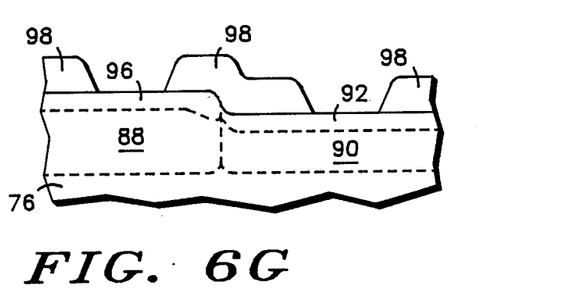
FIG. 6G illustrates a structure of a first possible isolation structure that may follow from FIG. 6F.
Figure 6H:
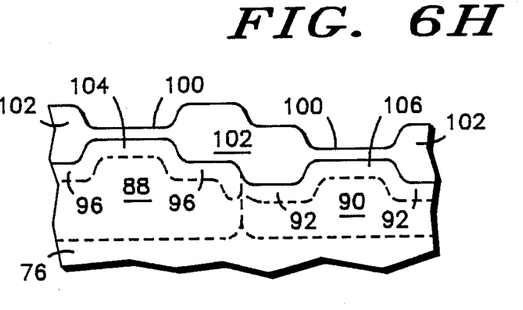
FIG. 6H illustrates a structure of a second possible isolation structure that may follow from FIG. 6F.

Now that the p-well 88 and n-well 90 have been formed, there remains to be created the relatively high/low well or graded well doping profile with the p-well 88 and the n-well 90 as the well regions having a low doping concentrations. As shown in FIG. 6E, arsenic, represented by the triangles, is ion implanted as a channel stop/punchthrough layer in a relatively high concentration but at low enough energy so that it does not penetrate the nitride layer 80 or penetrate deeply into the n-well 90. This implant could also be phosphorus. Note that p-well region is once again shielded by nitride pattern 80. A drive-in step forms shallow, relatively highly-doped n-layer 92, after which the n-well region 90 is oxidized to form thick oxide layer 94, or these two steps could be performed simultaneously. The nitride pattern 80 is stripped and a second boron implant is conducted at relatively high concentration and low energy to a shallow depth as seen in FIG. 6F. This second boron implant is driven-in to give a shallow, highly-doped p-layer 96 which serves as a channel stop or punchthrough prevention layer.

To finish up the process, the thick oxide layer 94 and thin oxide 78 are stripped and isolation regions are formed in one embodiment by using high pressure oxidation according to methods well-known in the art. A uniform oxidation process in which there is a direct pattern etch of the active regions will produce the structure seen in FIG. 6G which has island isolation regions. On the other hand a local oxidation of silicon (LOCOS) process will give a structure more like that seen in FIG. 6H which has thin gate oxide regions 100 and thicker isolation regions 102. It is also anticipated that with the LOCOS process result of FIG. 6H the shallow, highly-doped layers 92 and 96 will be divided into areas of somewhat different doping concentrations. For example, the surrounding p-layer 96 and active n-area 106 are expected to have a somewhat lower dopant concentration than the active p-area 104 and n-layer 92, respectively.

It may be seen that this new CMOS process produces self-aligned twin wells 88 and 90 as well as more relatively heavily doped surface layers 96 and 92 in each well using only one lithographic mask, not counting the mask used in the isolation procedure. The two types of wells and surface layers are essentially independent of each other, so little compensation is required of an n-layer 92 over a p-layer 96, for example. The more heavily doped surface layers 92 and 96 serve simultaneously as channel-stop layers, punchthrough prevention implants and/or highly doped surface layers to produce the desired transistor threshold voltages. To most effectively utilize this process, high-pressure oxidation using a short thermal cycle is recommended for use; however, the major benefits may also be obtained using atmospheric oxidation.

The method of this invention achieves the purposes of providing high/low impurity profiles in each well to optimize the NMOS and PMOS active transistors; providing close NMOS to PMOS transistor spacing; avoiding a channel-stop mask level and avoiding a threshold adjustment/punchthrough mask level. In addition, the depth of the shallow, heavily-doped surface layers may be independently achieved, which is an important advantage over the process of U.S. Pat. No. 4,554,726 illustrated in FIG. 5.

By way of example only, and not to limit the inventive method in any way, a few approximate values for the various parameters for a hypothetical process will now be given. The pad oxide grown before FIG. 6A may be approximately 300 Angstroms of silicon dioxide and the first boron implant conducted there may be approximately 10 keV, for example. The silicon nitride formed and patterned in FIG. 6B could be about 1200 Angstroms. As noted, the thick oxide region 84 is preferably grown using a high pressure, low temperature step to cause the boron in the future n-well area to be removed. Since boron will diffuse little during this oxidation, an oxide region 84 of about 2000 Angstroms should be sufficient in most cases.

The phosphorus implant seen in FIG. 6D-1 could be done at an energy of 30 keV, for example, whereas the one conducted under the second option in FIG. 6C-2 should be done at a higher energy, say around 200 keV. The twin wells 88 and 90 may be driven-in to give the structure of FIG. 6E using a mildly oxidizing ambient, to prevent too thick of an oxide growth over the n-well 90, for example to drive the wells to approximately 2.5 um deep. The thickness of thick oxide layer 94 may range around 2000 to 3000 Angstroms or more. If the highly-doped p-layer 96 is made very shallow, perhaps by using thin oxide over the n-well 90 to prevent too deep of a step at the well border, p-layer 96 may be driven in a bit before field oxidation. The shallow, relatively higher doped surface layer can be made shallower than is achievable by the simultaneous graded well drive-in of U.S. Pat. No. 4,554,726, due to the independent control of the present process. Also, with a final gate oxide of 250 Angstroms, a possible high-low doping profile may be $3 \times 10^{16}$ to $5 \times 10^{16}$ atoms/cm$^2$ in the shallow, highly-doped layers and about $5 \times 10^{15}$ atoms/cm$^2$ in the deep, low-doped wells.

Finally, in the isolation steps, a high-pressure field oxidation will prevent much spreading out laterally or vertically of the shallow, highly-doped layers 92 and 96, thus maintaining a relatively shallow high/low doping profile, unlike the single-mask process discussed with respect to FIG. 5.

I claim:

1. A process for fabricating an integrated circuit having a high/low doping profile in twin wells, where the profile is precisely placed using only one photomask for forming the wells and profiles, comprising the steps of:
   providing a semiconductor substrate having at least one major planar surface;
   forming a pad dielectric layer over the entire surface of the major planar surface of the substrate;
   blanket implanting the entire planar surface with an impurity of a first conductivity type;
   forming a pattern of masking material over selected portions of the pad dielectric layer thereby exposing the remainder of the pad dielectric layer in non-selected portions;
   physically removing the portion of the pad dielectric layer which is exposed in the non-selected portions of the major planar surface as well as the impurity of the first conductivity type in the portion of the substrate not covered by the masking material,
   reforming a pad dielectric layer over the substrate surface remaining and exposed after the removal of the impurity of the first conductivity type, and
   implanting an impurity of a second conductivity type into a region of the semiconductor substrate below the region of the substrate having the impurity of the first conductivity type that is removed;
   driving in the impurities of the first and second conductivity types to simultaneously form self-aligned deep, low-doped adjacent wells of opposite conductivity to a first selected depth and a second selected depth, respectively;
   implanting an impurity of the second conductivity type into the semiconductor substrate not covered by the pattern of masking material;
   driving in the implanted impurity of the second conductivity type to form a shallow, relatively high-doped surface layer of the second conductivity type at a third selected depth, where the third selected depth is closer to the substrate surface than to the second selected depth, and where the shallow, relatively high-doped surface layer of the second conductivity type is laterally coextensive with the deep, low-doped well of the second conductivity type;

forming a thick dielectric layer over the shallow, relatively high-doped layer of the second conductivity type;

removing the pattern of masking material;

implanting an impurity of the first conductivity type into the semiconductor substrate not covered by the thick dielectric layer; and driving in the implanted impurity of the first conductivity type to form a shallow, relatively high-doped surface layer of the first conductivity type at a fourth selected depth, where the fourth selected depth is closer to the substrate surface than to the first selected depth, and where the shallow, relatively high-doped surface layer of the first conductivity type is laterally coextensive with the deep, low-doped well of the first conductivity type.

2. The process of claim 1 wherein the semiconductor substrate is silicon, the impurity of the first conductivity type is boron and the impurity of the second conductivity type is selected from the group consisting of phosphorus and arsenic.

3. The process of claim 1 wherein the dielectric material is silicon dioxide and the masking material is silicon nitride.

4. A process for fabricating an integrated circuit having a high/low doping profile in twin wells, where the profile is precisely placed using only one photomask for forming the wells and profiles, produced by the process comprising the steps of:

providing a semiconductor substrate having at least one major planar surface;

forming a pad dielectric layer over the entire surface of the major planar surface of the substrate;

blanket implanting the entire surface with an impurity of a first conductivity type;

forming a pattern of masking material over selected portions of the pad dielectric layer thereby exposing the remainder of the pad dielectric layer is non-selected portions;

physically removing the portion of the pad dielectric layer which is exposed in the non-selected portions the major planar surface;

physically removing the impurity of the first conductivity type in the portion of the substrate not covered by the masking material;

reforming a pad dielectric layer over the substrate surface remaining and exposed after the removal of the impurity of the first conductivity type;

implanting an impurity of a second conductivity type into the region of the semiconductor substrate below the reformed pad dielectric layer;

driving in the impurities of the first and second conductivity types to simultaneously form selfaligned deep, low-doped adjacent wells of opposite conductivity to a first selected depth and a second selected depth, respectively;

implanting an impurity of the second conductivity type into the semiconductor substrate not covered by the pattern of masking material;

driving in the implanted impurity of the second conductivity type to form a shallow, relatively high-doped surface layer of the second conductivity type at a third selected depth, where the third selected depth is closer to the substrate surface than to the second selected depth, and where the shallow, relatively high-doped surface layer of the second conductivity type is laterally coextensive with the deep, low-doped well of the second conductivity type;

forming a thick dielectric layer over the shallow, relatively high-doped layer of the second conductivity type;

removing the pattern of masking material;

implanting an impurity of the first conductivity type into the semiconductor substrate not covered by the thick dielectric layer; and driving in the implanted impurity of the first conductivity type to form a shallow, highly doped surface layer of the first conductivity type at a fourth selected depth, where the fourth selected depth is closer to the substrate surface than to the first selected depth, and where the shallow, relatively high-doped surface layer of the first conductivity type is laterally coextensive with the deep, low-doped well of the first conductivity type.

* * * * *